（12）United States Patent
Shimogawara et al.

（10）Patent No.: US 10,991,904 B2
（45）Date of Patent: Apr. 27, 2021

(54) ORGANIC EL ELEMENT AND METHOD FOR MANUFACTURING SAME

(71) Applicant: SUMITOMO CHEMICAL COMPANY, LIMITED, Tokyo (JP)

(72) Inventors: Masaya Shimogawara, Niihama (JP); Shinichi Morishima, Tsukuba (JP); Masato Shakutsui, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/768,978

(22) PCT Filed: Jun. 6, 2016

(86) PCT No.: PCT/JP2016/066735
§ 371 (c)(1),
(2) Date: Apr. 17, 2018

(87) PCT Pub. No.: WO2017/068808
PCT Pub. Date: Apr. 27, 2017

(65) Prior Publication Data
US 2019/0067626 A1 Feb. 28, 2019

(30) Foreign Application Priority Data
Oct. 20, 2015 (JP) .............................. JP2015-206467

(51) Int. Cl.
*H01L 51/52* (2006.01)
*H05B 33/06* (2006.01)
(Continued)

(52) U.S. Cl.
CPC ...... *H01L 51/5237* (2013.01); *H01L 51/5209* (2013.01); *H01L 51/529* (2013.01);
(Continued)

(58) Field of Classification Search
CPC ............. H01L 51/5237; H01L 51/5228; H01L 51/5209; H01L 51/56; H01L 51/529;
(Continued)

(56) References Cited

U.S. PATENT DOCUMENTS

2012/0104365 A1   5/2012  Ratier et al.
2015/0357572 A1*  12/2015  Osaki ................. H01L 51/0024
                                                            438/26

FOREIGN PATENT DOCUMENTS

JP    2009-016185 A    1/2009
JP    2009-187774 A    8/2009
(Continued)

OTHER PUBLICATIONS

Communication dated Aug. 9, 2016, from the Japanese Patent Office in counterpart application No. 2015-206467.
(Continued)

*Primary Examiner* — Jack S Chen
(74) *Attorney, Agent, or Firm* — Sughrue Mion, PLLC

(57) ABSTRACT

An organic EL element comprises a supporting substrate 12 having a first side surface 12b and a second side surface 12c located opposite to the first side surface in the first direction, a first electrode-attached on the supporting substrate, an organic EL body 16 disposed on the first electrode, a second electrode 18 disposed extending from the first side surface to the second side surface and covering at least a part of the organic EL body, and a sealing member disposed on the second electrode, extending from the first side surface to the second side surface and sealing at least the organic EL body, each of the side surfaces 18a and 20a of the second electrode and the sealing member on the first side surface-side being made evened with the first side surface, and each of the side surfaces 18b and 20b of the second electrode and the sealing (Continued)

member on the second side surface-side being made evened with the second side surface, in the first direction.

9 Claims, 15 Drawing Sheets

(51) Int. Cl.
H05B 33/26 (2006.01)
H05B 33/10 (2006.01)
H05B 33/22 (2006.01)
H05B 33/04 (2006.01)
H01L 51/56 (2006.01)

(52) U.S. Cl.
CPC ...... H01L 51/5225 (2013.01); H01L 51/5228 (2013.01); H01L 51/56 (2013.01); H05B 33/04 (2013.01); H05B 33/06 (2013.01); H05B 33/10 (2013.01); H05B 33/22 (2013.01); H05B 33/26 (2013.01); H01L 51/524 (2013.01); H01L 2251/5361 (2013.01); H01L 2251/5392 (2013.01); H01L 2251/556 (2013.01)

(58) Field of Classification Search
CPC ........... H01L 51/5225; H01L 2251/556; H01L 2251/5392; H01L 2251/56361; H01L 51/524; H01L 23/48; H01L 51/5203; H01L 51/5259; H01L 2251/53; H01L 2251/566; H05B 33/06; H05B 33/26; H05B 33/10; H05B 33/22; H05B 33/04

See application file for complete search history.

(56) References Cited

FOREIGN PATENT DOCUMENTS

| | | |
|---|---|---|
| JP | 2014-022158 A | 2/2014 |
| JP | 2014-209448 A | 11/2014 |
| WO | 2007/025188 A1 | 3/2007 |
| WO | 2012/121251 A1 | 9/2012 |

OTHER PUBLICATIONS

International Search Report, issued by International Searching Authority in corresponding International Application No. PCT/JP2016/066735, dated Aug. 16, 2016.
International Preliminary Report on Patentability with a Translation of Written Opinion issued from the International Bureau in counterpart International Application No. PCT/JP2016/066735, dated May 3, 2018.
Extended European Search Report dated May 29, 2019 in counterpart EP 16857126.3.

* cited by examiner

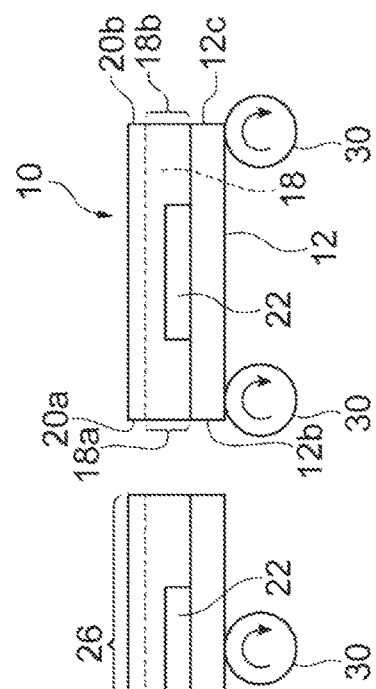
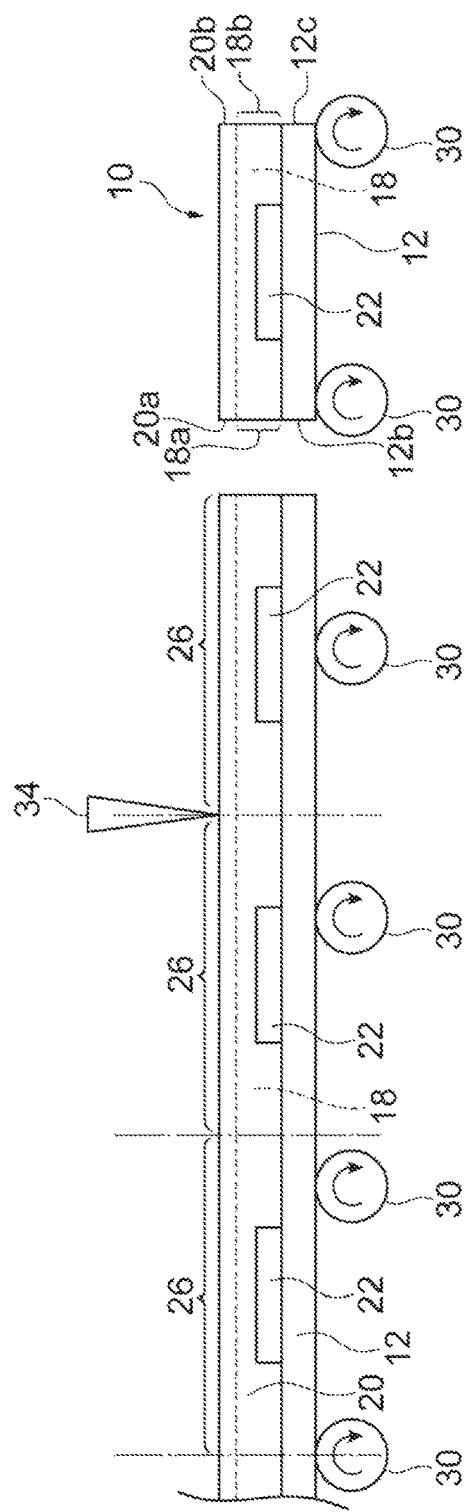

ORGANIC EL ELEMENT AND METHOD FOR MANUFACTURING SAME

CROSS REFERENCE TO RELATED APPLICATIONS

This application is a National Stage of International Application No. PCT/JP2016/066735 filed Jun. 6, 2016, claiming priority based on Japanese Patent Application No. 2015-206467 filed Oct. 20, 2015.

TECHNICAL FIELD

The present invention relates to an organic EL element and a method for manufacturing organic EL elements.

BACKGROUND ART

As an organic electroluminescence (EL) element, the organic EL element described in Patent Literature 1 is known. The organic EL element described in Patent Literature 1 has a substrate, a first electrode layer including a plurality of transparent electrodes disposed in the column direction on the substrate, an organic layer disposed on the first electrode layer, and a second electrode layer disposed on the organic layer, extending in the column direction.

CITATION LIST

Patent Literature

Patent Literature 1: Japanese Unexamined Patent Publication No. 2009-187774

SUMMARY OF INVENTION

Technical Problem

In the organic EL element described in Patent Literature 1, the second electrode layer is disposed inside the edge of the substrate, when viewed from the thickness direction of the substrate. As described in Patent Literature 1, the second electrode layer is made by forming a metal film (an aluminum film in Patent Literature 1), to be the second electrode layer, on an organic layer, which is then subjected to patterning by etching utilizing photolithography technique to obtain a desired pattern. In this case, because patterning of the metal film is required, the productivity declines.

The present invention provides an organic EL element with improved productivity, and a method for manufacturing organic EL elements.

Solution to Problem

The organic EL element according to one aspect of the present invention comprises a supporting substrate having a first side surface and a second side surface located opposite to the first side surface in a first direction, a first electrode disposed on the supporting substrate, an organic EL body disposed on the first electrode and including a light emitting layer, a second electrode disposed extending from the first side surface to the second side surface, and covering at least a part of the organic EL body, and a sealing member disposed on the second electrode, extending from the first side surface to the second side surface, and sealing at least the organic EL body. In the first direction, each of the side surfaces of the second electrode and the sealing member on the first side surface-side is made evened with the first side surface, and each of the side surfaces of the second electrode and the sealing member on the second side surface-side is made evened with the second side surface.

In the configuration described above, the second electrode is disposed on the support substrate, extending from the first side surface to the second side surface. In the first direction, each of the side surfaces of the second electrode and the sealing member on the first side surface-side is made evened with the first side surface, and each of the side surfaces of the second electrode and the sealing member on the second side surface-side is made evened with the second side surface. When the second electrode is formed, no patterning is therefore required at least in the first direction. As a result, the productivity of organic EL elements can be improved.

In an embodiment, the first electrode may have a first region and a second region adjacent to the first region, in a second direction perpendicular to a thickness direction of the supporting substrate and the first direction; the organic EL body may cover the first region; and an edge of the second region on the opposite side of the first region may be exposed from the sealing member in the second direction.

In this case, since the first region is covered with the organic EL body, a short circuit between the first region and, for example, the second electrode hardly occurs. Further, since the second region is exposed from the sealing member, a voltage can be applied to the first region by connecting an external connecting terminal to the second region.

In an embodiment, the second electrode may cover a part of the organic EL body other than an edge on the second region-side.

In the second direction, the edge of the organic EL body on the second region-side may be covered with a hygroscopic part.

In this case, the edge on the second region-side as a part not covered with the second electrode in the organic EL body is covered with the hygroscopic part. The moisture, therefore, hardly reaches the organic EL body, so that deterioration of the organic EL element can be further suppressed.

In an embodiment, the second electrode may cover the organic EL body, and an insulating layer may be disposed between the second region and the second electrode.

Since the organic EL body is covered with the second electrode, moisture hardly reaches the organic EL body. Deterioration of the organic EL element can be therefore further suppressed. Since an insulating layer is disposed between the second region and the second electrode, the short circuit between the first and the second electrodes can be prevented, even though the second electrode covers the organic EL body.

In an embodiment, an extracting electrode in electrically contact with the second electrode may be further disposed on the supporting substrate. The extracting electrode may be disposed on the opposite side of the second region in the second direction when viewed from the first region, and a part of the extracting electrode may be exposed from the sealing member. A voltage can be thereby applied to the second electrode through the extracting electrode.

The second electrode may comprise transition metal oxides, aluminum or silver.

A method for manufacturing organic EL elements according to another aspect of the present invention comprises: a step of, while conveying a long electrode-attached substrate having a long supporting substrate and first electrodes disposed respectively in a plurality of regions for forming organic EL elements set in the longitudinal direction on the supporting substrate in the longitudinal direction, forming an organic EL body including a light emitting layer on the first electrode in each of the regions for forming organic EL elements; a step of, while conveying the electrode-attached substrate including the organic EL bodies formed thereon in the longitudinal direction, forming a second electrode extending in the longitudinal direction so as to cover at least a part of the organic EL bodies formed respectively in a plurality of regions for forming organic EL elements; a step of, while conveying the electrode-attached substrate including the second electrode formed thereon in the longitudinal direction, sticking a sealing member extending in the longitudinal direction to the electrode-attached substrate from the second electrode-side so as to seal at least the organic EL bodies formed respectively in a plurality of regions for forming organic EL elements; and a step of, while conveying the electrode-attached substrate including the sealing member stuck thereto in the longitudinal direction, cutting the electrode-attached substrate for each of a plurality of the regions for forming organic EL elements so as to obtain organic EL elements.

In the manufacturing method, while a long electrode-attached substrate including organic EL bodies formed thereon is being conveyed, a long second electrode is formed over a plurality of regions for forming organic EL elements. Subsequently, while the electrode-attached substrate having the second electrode formed thereon is being conveyed in the longitudinal direction, a sealing member extending in the longitudinal direction is stuck to the electrode-attached substrate from the second electrode-side so as to seal the organic EL bodies. Subsequently, the electrode-attached substrate is cut for each of a plurality of the regions for forming organic EL elements so as to obtain organic EL elements. The organic EL elements of the present invention can be thereby suitably manufactured. In this method, the second electrode of each of the organic EL elements is formed by forming the second electrode over a plurality of the regions for forming organic EL elements and then cutting the electrode in the longitudinal direction. No patterning of the second electrode is therefore required at least in the longitudinal direction of the electrode-attached substrate, so that the productivity of the organic EL elements is improved.

Advantageous Effects of Invention

According to the present invention, an organic EL element and a method for manufacturing organic EL elements with improved productivity are provided.

BRIEF DESCRIPTION OF DRAWINGS

FIG. 10(A) is a diagram illustrating a step of cutting, and FIG. 10(B) is the side view of an organic EL element cut out from an electrode-attached substrate in the step of cutting.

DESCRIPTION OF EMBODIMENTS

With reference to attached drawings, preferred embodiments of the present invention are described in detail as follows. In the description of drawings, the same symbols are used for the same or equivalent elements, and redundant descriptions are omitted.

Figure 1:
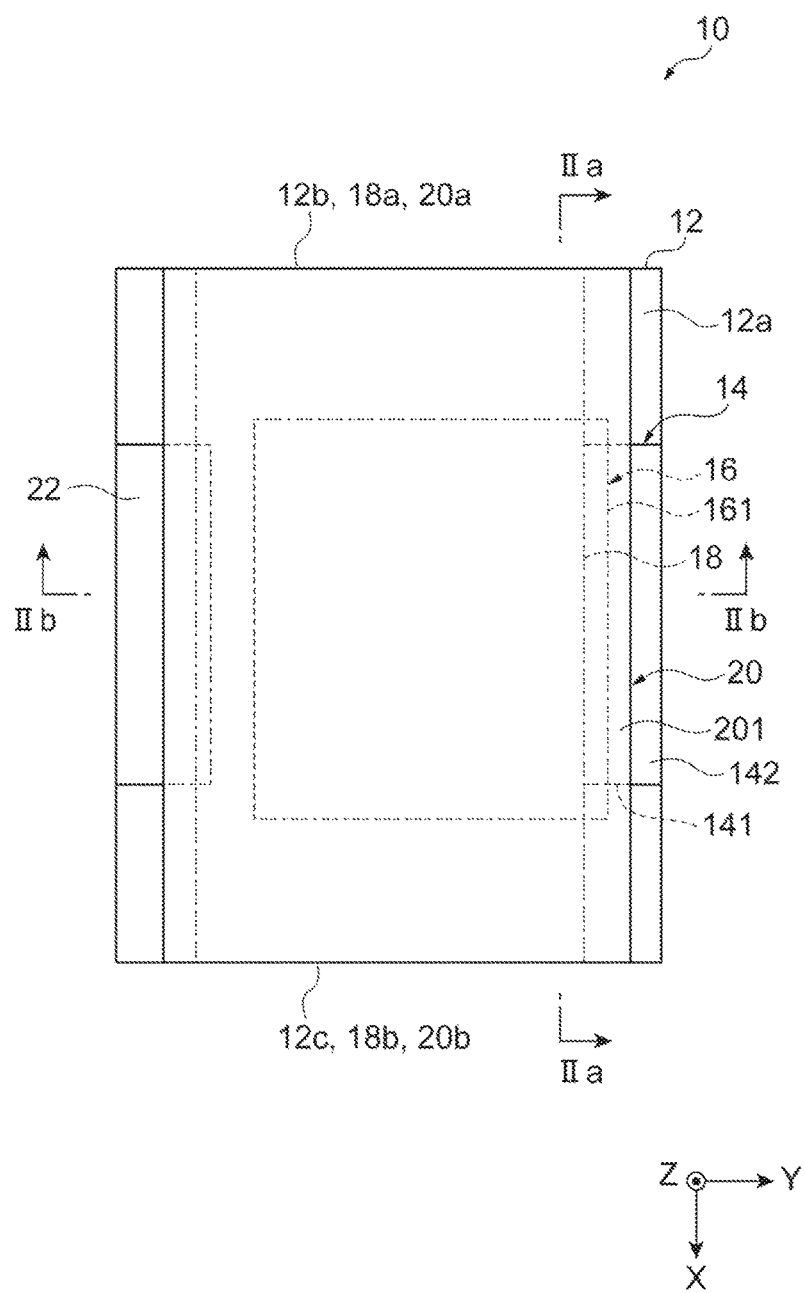
FIG. 1 is a plan view of an organic EL element in an embodiment.
Figure 2A:
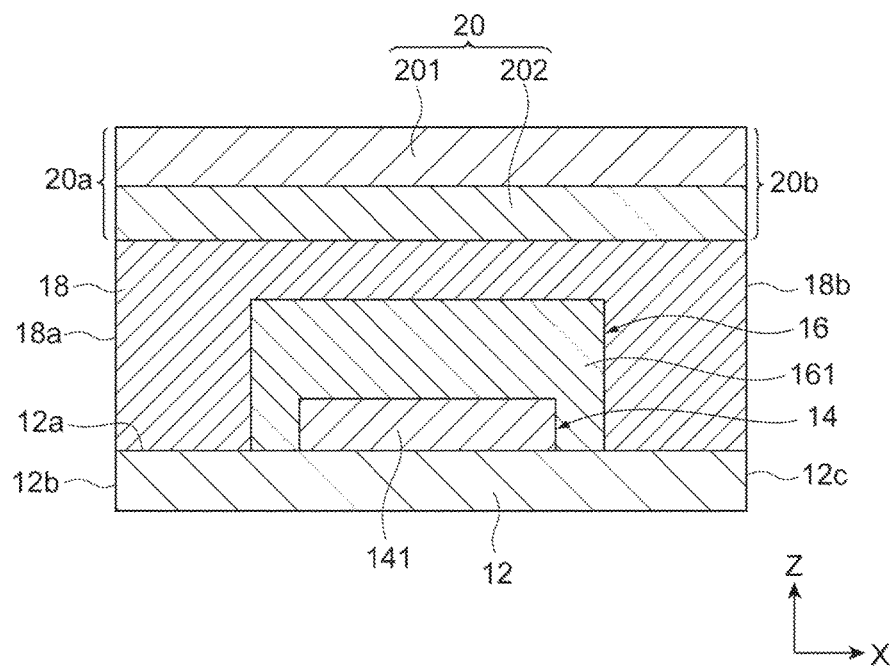
FIG. 2(A) is a cross-sectional view taken from line IIa-IIa in FIG. 1.
Figure 2B:
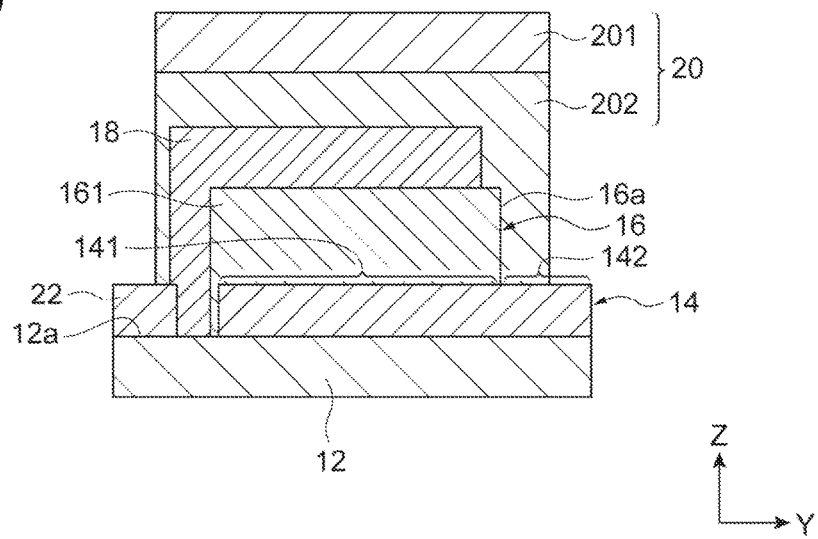
FIG. 2(B) is a cross-sectional view taken from line IIb-IIb in FIG. 1.

As shown in FIG. 1, FIG. 2(A) and FIG. 2(B), an organic EL element 10 in an embodiment comprises a supporting substrate 12, an anode (first electrode) 14, an organic EL body 16, a cathode (second electrode) 18, and a sealing member 20. In an embodiment, the organic EL element 10 may comprise an extracting electrode 22. Hereinafter, configurations including the extracting electrode 22 are described unless otherwise noted.

For convenience of explanation, as shown in FIG. 1, FIG. 2(A) and FIG. 2(B), the thickness direction of the supporting substrate 12 is referred to as Z-axis direction, and the directions perpendicular to the Z-axis direction are referred to also as X-axis direction (first direction) and Y-axis direction (second direction). The X-axis direction and the Y-axis direction are perpendicular to each other. The X-axis direction corresponds to the conveying direction of the supporting substrate 12 and the Y-axis direction corresponds to the width direction of the supporting substrate 12 in a method for manufacturing organic EL elements 10 to be described below.

[Supporting Substrate]

A supporting substrate 12 is made of a resin having translucency to visible light (light with a wavelength ranging from 400 nm to 800 nm). The supporting substrate 12 may be a film-like substrate. In a first embodiment, the supporting substrate 12 has flexibility. The thickness of the supporting substrate 12 is, for example, 30 µm or more and 500 µm or less.

The supporting substrate 12 is, for example, a plastic film. The material of the supporting substrate 12 includes, for example, polyether sulfone (PES); polyester resins such as polyethylene terephthalate (PET) and polyethylene naphthalate (PEN); polyolefin resins such as polyethylene (PE), polypropylene (PP), and cyclic polyolefins; polyamide resins; polycarbonate resins; polystyrene resins; polyvinyl alcohol resins; saponified ethylene-vinyl acetate copolymers; polyacrylonitrile resins; acetal resins; polyimide resin; and epoxy resins.

Among the resins as the material for the supporting substrate 12, polyester resins and polyolefin resins are preferable and polyethylene terephthalate and polyethylene naphthalate are particularly preferable, because of high heat resistance, a low linear expansion coefficient, and low manufacturing cost. One of these resins may be used alone, or two or more of these may be used in combination.

On a main surface 12a of the supporting substrate 12, a barrier film may be disposed. The barrier film may be a film comprising, for example, silicon, oxygen and carbon, or may be a film comprising silicon, oxygen, carbon and nitrogen. Specifically, examples of the barrier film material include silicon oxide, silicon nitride, and silicon oxynitride. The thickness of the barrier film is, for example, 100 nm or more and 10 µm or less.

[Anode]

An anode 14 is disposed on the main surface 12a of the supporting substrate 12. As the anode 14, an electrode layer exhibiting optical transparency is used. As the electrode exhibiting optical transparency, a thin film of metal oxides, metal sulfides, metals or the like having high electric conductivity can be used, and a thin film having a high light transmittance is suitably used. For example, a thin film consisting of indium oxide, zinc oxide, tin oxide, indium tin oxide (abbreviation: ITO), indium zinc oxide (abbreviation: IZO), gold, platinum, silver, copper or the like is used, and, among these, a thin film consisting of ITO, IZO, or tin oxide is suitably used. As the anode 14, a transparent conductive film of organic material such as polyaniline and derivatives thereof and polythiophene and derivatives thereof may be also used. The anode 14 may have a network structure consisting of a conductor (e.g., metal).

The thickness of the anode 14 may be determined by taking into consideration the translucency of light, electric conductivity and the like. The thickness of the anode 14 is usually 10 nm to 10 µm, preferably 20 nm to 1 µm, more preferably 50 nm to 500 nm.

Examples of the method for forming the anode 14 include vacuum deposition, sputtering, ion plating, plating and coating.

The anode 14 has an anode body (first region) 141 covered with the organic EL body 16 and a part not covered with the organic EL body 16, i.e., an external connecting part (second region) 142 as remaining part other than the anode body 141. The external connecting part 142 is disposed in the Y-axis direction when viewed from the anode body 141, adjacent to the anode body 141. A part of the external connecting part 142 is pulled out from the sealing member 20, and the external connecting part 142 functions as a connection region for connecting an external connecting terminal to the anode 14.

[Extracting Electrode]

An extracting electrode 22 is disposed at a predetermined distance from the anode 14. In an embodiment shown in FIG. 1, the extracting electrode 22 is disposed on the opposite side of the external connecting part 142 of the anode 14 in the Y-axis direction. The extracting electrode 22 is electrically connected to the cathode 18, functioning as a connection region for electrically connecting an external connecting terminal to the cathode 18 so as to apply a voltage to the cathode 18. The thickness of the extracting electrode 22 is equivalent to the thickness of the anode 14. The material of the extracting electrode 22 is the same as the material of the anode 14.

[Organic EL Body]

An organic EL body 16 including a light emitting layer 161 is a functional part to contribute light emission of the organic EL element 10, moving carriers and recombining carriers corresponding to the voltage applied to the anode 14 and the cathode 18. In the example shown in FIG. 1, FIG. 2(A) and FIG. 2(B), the organic EL body 16 has a single-layer structure including a light emitting layer 161.

The light emitting layer 161 is an organic layer disposed on the anode 14. The light emitting layer 161 is typically formed of mainly an organic material emitting fluorescence and/or phosphorescence or the organic material and a dopant to assist the same. The dopant is added, for example, to improve luminous efficiency or to change the emission wavelength. The organic material contained in the light emitting layer 161 may be a low-molecular compound or a high-molecular compound. Examples of the light emitting material to constitute the light emitting layer 161 include known dye materials, metal complex materials, polymer materials, and dopant materials.

The thickness of the light emitting layer 161 is typically about 2 nm to 200 nm. The light emitting layer 161 is formed by the coating method with use of a coating liquid containing the light emitting material. The solvent of the coating liquid containing the light emitting material is not limited as long as the light emitting material is dissolved therein. Examples of the coating method include ink jet printing, though any other known coating method may be employed.

The organic EL body 16 is disposed to cover the anode body 141 of the anode 14. The short circuit between the anode body 141 and other electrodes (e.g., cathode 18 and extracting electrode 22) is thereby prevented. Since the organic EL body 16 covers the anode body 141 of the anode 14, a part of the organic EL body 16 is disposed also on the main surface 12a of the supporting substrate 12.

As described above, an embodiment in which the organic EL body 16 is a light emitting layer 161 is shown as an example in FIG. 1, FIG. 2(A) and FIG. 2(B), the organic EL body 16 may be a laminate including the light emitting layer 161 and other functional layers. An example of the layer configuration in this case is described as follows.

Examples of the functional layer disposed between the anode 14 and the light emitting layer 161 include a hole injection layer and a hole transport layer. Examples of the layer disposed between the cathode 18 and the light emitting layer 161 include an electron injection layer and an electron transport layer. Known materials may be used as the materials for the hole injection layer, the hole transport layer, the electron transport layer and the electron injection layer, respectively. The thickness of the hole injection layer, the hole transport layer, the electron transport layer and the electron injection layer may be appropriately set depending on the element performance of the organic EL element 10.

The hole injection layer is a layer having a function to improve the hole injection efficiency from the anode 14 to the light emitting layer 161. The hole transport layer is a layer having a function to improve the hole injection into the light emitting layer 161 from the anode 14, the hole injection layer or the hole transport layer closer to the anode 14. When the hole injection layer and/or the hole transport layer have a function to block the transport of electrons, these layers may be referred to also as electron blocking layers.

The electron injection layer is a layer having function to improve the electron injection efficiency from the cathode 18 to the light emitting layer 161. As described below, the electron injection layer constitutes a part of the cathode 18 in some cases. The electron transport layer is a layer having a function to improve the electron injection from the cathode 18, the electron injection layer or the electron transport layer closer to the cathode 18. In the case where the electron injection layer and/or the electron transport layer have a function to block the transport of holes, these layers may be referred to also as hole blocking layers in some cases.

Examples of the layer configuration of the organic EL element 10 including the various functional layers described above are as follows.

a) anode/light emitting layer/cathode b) anode/hole injection layer/light emitting layer/cathode c) anode/hole injection layer/light emitting layer/electron injection layer/cathode d) anode/hole injection layer/light emitting layer/electron transport layer/electron injection layer/cathode e) anode/hole injection layer/hole transport layer/light emitting layer/cathode f) anode/hole injection layer/hole transport layer/light emitting layer/electron injection layer/cathode g) anode/hole injection layer/hole transport layer/light emitting layer/electron transport layer/electron injection layer/cathode h) anode/light emitting layer/electron injection layer/cathode i) anode/light emitting layer/electron transport layer/electron injection layer/cathode The symbol "/" means that the layers on both sides of the symbol "/" are joined to each other. The configuration a) described above corresponds to the configuration shown in FIG. 1 to FIG. 3.

The organic EL element 10 may have a single light emitting layer 161 or may have two or more light emitting layers 161. In any one of the layer configurations a) to i) described above, a laminate structure disposed between the anode 14 and the cathode 18 is defined as "structural unit A". Examples of the configuration of the organic EL element 10 having two light emitting layers 161 include a layer configuration j) described below. The layer configurations of the two (structural units A) may be the same or different from each other.

j) anode/(structural unit A)/charge generation layer/(structural unit A)/cathode In this specification, the charge generation layer is a layer for generating holes and electrons by application of an electric field. Examples of the charge generation layer may include a thin film consisting of vanadium oxide, ITO, molybdenum oxide, or the like.

With "(structural unit A)/charge generation layer" defined as "structural unit B", examples of the configuration of the organic EL element 10 having three or more-layered light emitting layers 161 include a layer configuration k) described below.

k) anode/(structural unit B)x/(structural unit A)/cathode

The symbol "x" represents an integer of 2 or more, and "(structural unit B)x" represents a laminate including x-layered (structural units B). The layer configurations of a plurality of the (structural units B) may be the same or different.

A plurality of light emitting layers 161 may be directly laminated without a charge generation layer so as to configure the organic EL element 10.

[Cathode]

A cathode 18 is disposed on the organic EL body 16 so as to cover at least a part of the organic EL body 16. The cathode 18 is disposed so as to extend between the side surface (first side surface) 12b and the side surface (second side surface) 12c which are both side surfaces of the supporting substrate 12 in the X-axis direction. In the first embodiment, the cathode 18 is disposed to cover a part of the organic EL body 16 other than an edge 16a on the external connecting part 142 side of the anode 14 (refer to FIG. 2(B)) for prevention of the short circuit to the anode 14. In other words, the cathode 18 is disposed such that the edge 16a of the organic EL body 16 on the external connecting part 142 side is exposed from the cathode 18 when viewed from the thickness direction of the supporting substrate 12, and the cathode 18 is disposed also on a main surface 12a of the supporting substrate 12.

As a result, in an embodiment with an extracting electrode 22 provided therein, the cathode 18 is disposed also on the main surface 12a between the extracting electrode 22 and the anode 14, and the cathode 18 and the extracting electrode 22 are connected as shown in FIG. 2(B). Even with the cathode 18 being disposed, since the anode body 141 is covered with the organic EL body 16 as described above, the short circuit between the cathode 18 and the anode 14 is prevented. Examples of the material of the cathode 18 are described below.

The thickness of the cathode 18 is set by taking into consideration the electric conductivity and the durability. The thickness of the cathode 18 is typically 10 nm to 10 µm, preferably 20 nm to 1 µm, more preferably 50 nm to 500 nm.

[Sealing Member]

A sealing member 20 is disposed on the cathode 18 so as to embed the organic EL body 16. The sealing member 20 is disposed on the supporting substrate 12 and extends between the side surfaces 12b and 12c of the supporting substrate 12 so as to seal at least the organic EL body 16. The width of the sealing member 20 in the Y-axis direction is narrower than the width of the supporting substrate 12, and the sealing member 20 is disposed on the supporting substrate 12 such that a part of the external connecting part 142 and a part of the extracting electrode 22 are exposed (or pulled out) from the sealing member 20. The sealing member 20 has a sealing substrate 201 and an adhesive part 202.

The sealing substrate 201 is disposed on the opposite side of the supporting substrate 12 in the organic EL element 10. The sealing substrate 201 consists of a metal foil, a barrier film including a transparent plastic film of which the front face, the rear face, or both faces have a functional barrier layer, a thin film glass having flexibility, a plastic film on which a metal having barrier properties is laminated, or the like, and has a gas barrier function, in particular, moisture barrier function. As the metal foil, a copper foil, an aluminum foil, and a stainless steel foil are preferred from the viewpoint of barrier properties. Although it is more preferable to increase the thickness of the metal foil from the viewpoint of preventing pinholes, a thickness of 15 µm to 50 µm is preferred considering the viewpoint of flexibility.

The adhesive part 202 is disposed on the surface of the sealing substrate 201 on the supporting substrate 12 side for use to stick the sealing substrate 201 to the supporting substrate 12 having the anode 14, the organic EL body 16 and the cathode 18 formed thereon. The adhesive part 202 covers at least the anode body 141, the organic EL body 16, and a part of the cathode 18 other than both side surfaces in the X-axis direction, i.e., the side surfaces 18a and 18b. In the following description, the part covered with the adhesive part 202 in the configuration of the supporting substrate 12 is referred to as the covered part. The thickness of the adhesive part 202 may be any thickness that allows the covered part to be covered, for example, 1 µm to 100 µm, preferably 5 µm to 60 µm, more preferably 10 µm to 30 µm.

Specifically, the adhesive part 202 is made from a photocurable or thermosetting acrylate resin, or a photocurable or thermosetting epoxy resin. Alternatively, a resin film that can be fused by a commonly used impulse sealer, e.g., a heat sealable film such as an ethylene vinyl acetate copolymer (EVA), a polypropylene film, a polyethylene film and a polybutadiene film, may be used. Further, a thermoplastic resin may be also used.

As the adhesive for use in the adhesive part 202, an adhesive that achieves high adhesion between the covered part covered with the adhesive part 202 and the adhesive part 202, and has high effects for suppressing the marked thermal contraction of the adhesive, the detachment of the covered part due to a stress applied to the covered part, the generation of components having a bad effect on the covered part from the adhesive part 202, and the generation and growth of dark spots with high barrier properties, is preferred.

As shown in FIG. 2(A), the side surface 12b of the supporting substrate 12, the side surface 18a of the cathode 18, and the side surface 20a of the sealing member 20 are made evened in the X-axis direction of the organic EL element 10. In other words, the side surface 18a of the cathode 18 is disposed at the same position as the side surface 12b and the side surface 20a in the X-axis direction. In the first embodiment, the side surface 18a is flushed with the side surface 12b and the side surface 20a. Similarly, the side surface 12c on the opposite side of the side surface 12b of the supporting substrate 12, the side surface 18b on the opposite side of the side surface 18a of the cathode 18, and the side surface 20b on the opposite side of the side surface 20a of the sealing member 20 are made evened, in the X-axis direction of the organic EL element 10. In other words, the side surface 18b of the cathode 18 is disposed at the same position as the side surface 12c and the side surface 20b in the X-axis direction. In the first embodiment, the side surface 18b is flushed with the side surface 12c and the side surface 20b.

In this configuration, the side surfaces 18a and 18b of the cathode 18 are exposed without covered by the sealing member 20. It is therefore preferable that the material for the cathode 18 be a material that is substantially insensitive to the moisture effect. From this viewpoint, examples of the material for the cathode 18 include transition metal oxides, aluminum and silver. The cathode 18 may be made from one metal or an alloy of the metals described above as examples. Further, the cathode may have a multi-layer structure.

Figure 3:
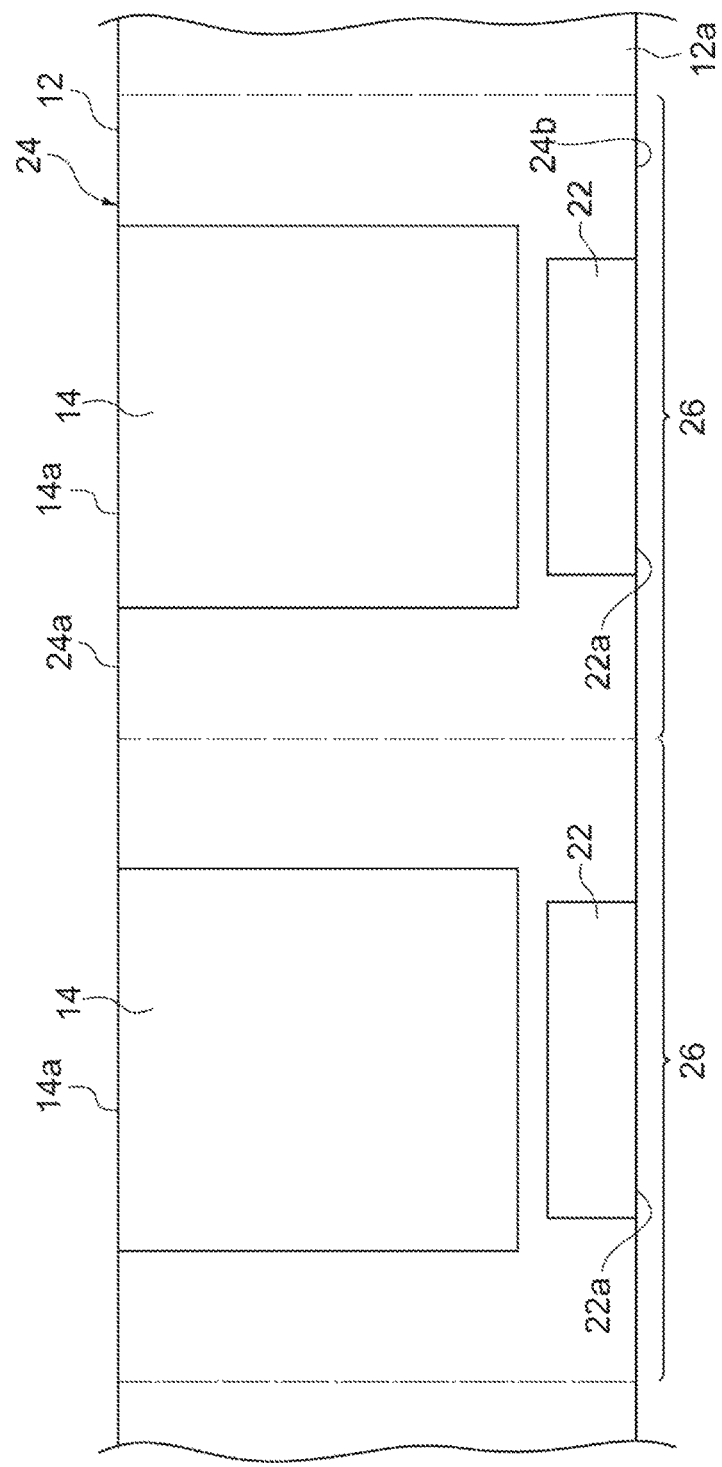
FIG. 3 is a top view of a long electrode-attached substrate for use in the method for manufacturing organic EL elements.

With reference to FIG. 3 to FIG. 10(A) and FIG. 10(B), a method for manufacturing organic EL elements 10 is described as follows. In this specification, as shown in FIG. 3, a method for manufacturing organic EL elements 10, using roll-to-roll method, from a long electrode-attached substrate 24 having a long and flexible supporting substrate 12, a plurality of cathodes 14 and a plurality of extracting electrodes 22 and in which the plurality of cathodes 14 are discretely disposed in the longitudinal direction is described.

A plurality of regions 26 for forming organic EL elements are virtually disposed on the main surface 12a of the long supporting substrate 12, and an anode 14 and an extracting electrode 22 are disposed on each of the regions 26 for forming organic EL elements. Accordingly, the numbers of the anodes 14 and the extracting electrodes 22 are the same, and one extracting electrode 22 is disposed corresponding to one anode 14, at a predetermined distance in the direction perpendicular to the longitudinal direction of the supporting substrate 12 (hereinafter, referred to also as "width direction"). The anode 14 and the extracting electrode 22 can be formed, for example, by forming an electrode film to make the anode 14 and the extracting electrode 22 and then processing the electrode film into a predetermined pattern using, for example, fine processing technology such as photolithography.

In the example shown in FIG. 3, the side surface 14a of the anode 14 is formed at the same position as the edge 24a of the electrode-attached substrate 24, and the side surface 22a of the extracting electrode 22 is formed at the same position as the edge 24b on the opposite side of the edge 24a of the electrode-attached substrate 24. The anode 14, however, may be formed at a certain distance away from the edge 24a, and the extracting electrode 22 also may be formed at a certain distance away from the edge 24b, in the width direction of the electrode-attached substrate 24.

The method for manufacturing organic EL elements 10 comprises a body-forming step S10 of forming organic EL body 16, a cathode-forming step S12 of forming a cathode 18, a sealing step S14 of sealing the organic EL body 16 with a sealing member 20, and a cutting step S16 of cutting out the organic EL elements 10. In the first embodiment, as conceptually shown in FIG. 4, while a long flexible electrode-attached substrate 24 stretched between an unwinding roll 28A and winding roll 28B is being continuously conveyed with conveying rollers 30, the body-forming step S10, the cathode-forming step S12, and the sealing step S14 are performed by a roll-to-roll method, and then the cutting step S16 is performed. Each of the steps is described in detail as follows.

(Organic EL Body-Forming Step)

Figure 5:
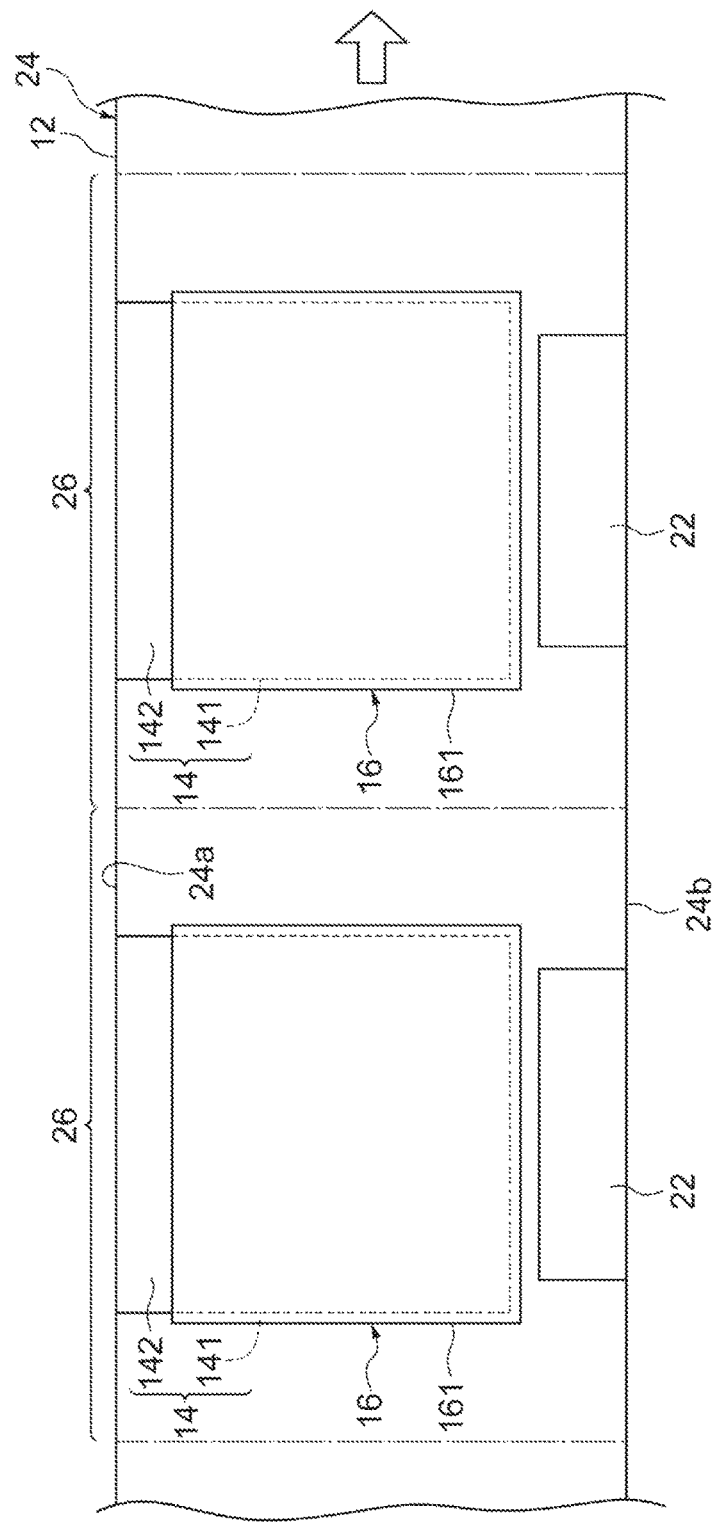
FIG. 5 is a diagram illustrating a step of forming bodies.

In a body-forming step S10, while the electrode-attached substrate 24 is being conveyed in the longitudinal direction thereof, the organic EL body 16 is formed, for example, by the coating method such that the anode 14 on the edge 24b side of the electrode-attached substrate 24 is covered and the anode 14 on the edge 24a side is exposed as shown in FIG. 5. For example, as shown in FIG. 5, in the case where the organic EL body 16 is a light emitting layer 161, a coating liquid containing a material to make the light emitting layer 161 is applied to the region for forming the organic EL body 16 and dried, so that the light emitting layer 161 as the organic EL body 16 is formed. Examples of the coating method include an ink-jet printing method.

In an embodiment with the organic EL body 16 having functional layers other than the light emitting layer 161, each of the functional layers may be sequentially formed from the anode 14 side while the electrode-attached substrate 24 is being conveyed, by the same method as for the light emitting layer 161 described above. The method for forming the organic EL body 16 is not limited to the coating method as long as the organic EL body 16 can be formed.

In the anode 14, the region covered with the organic EL body 16 is an anode body 141 shown in FIG. 1, FIG. 2(A) and FIG. 2(B), and the region exposed from the organic EL body 16 is an external connecting part 142.

(Cathode-Forming Step)

Figure 6:
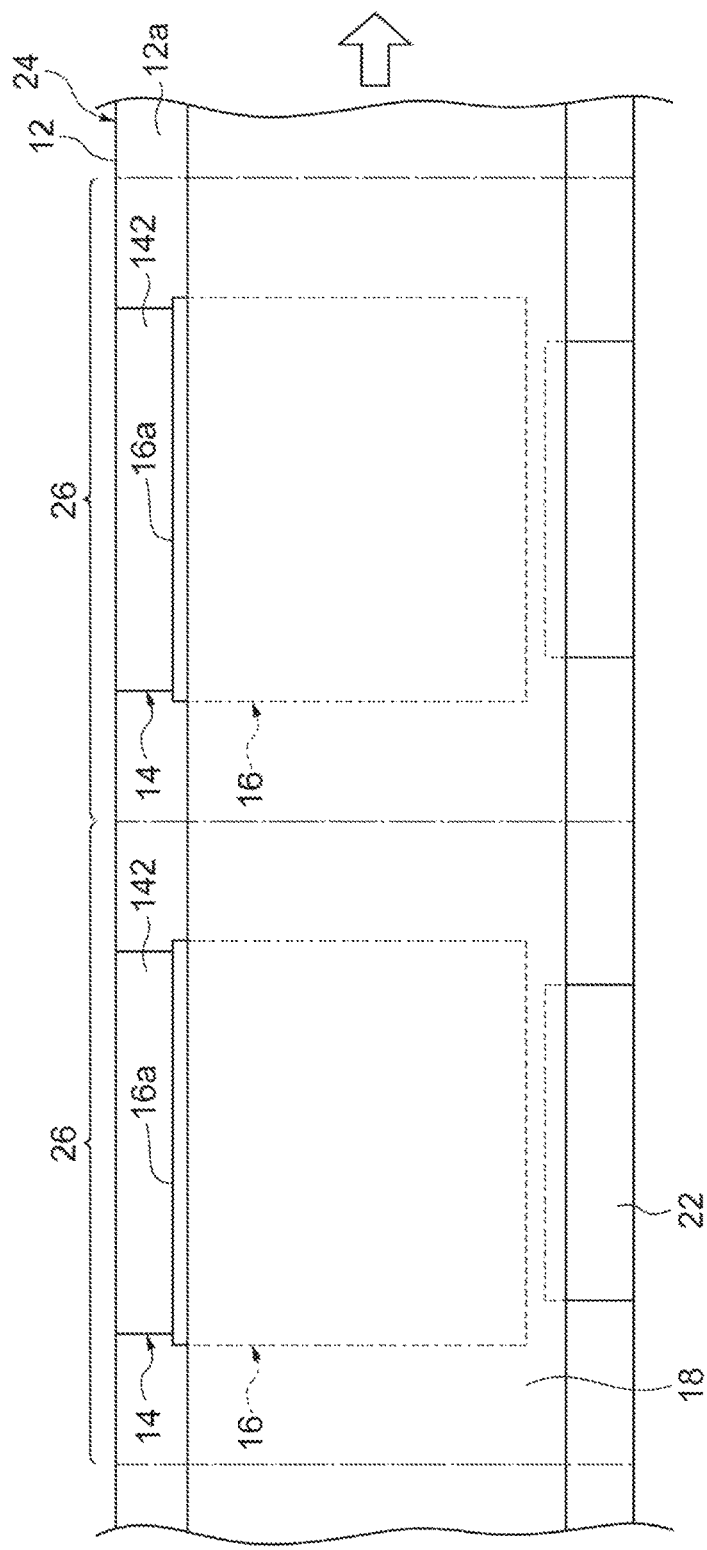
FIG. 6 is a diagram illustrating a step of forming cathodes.

In a cathode-forming step S12, while the electrode-attached substrate 24 is being conveyed in the longitudinal direction thereof, the cathode 18 is formed on the organic EL body 16 as shown in FIG. 6. On this occasion, in the first embodiment, the cathode 18 is formed such that the edge 16a of the organic EL body 16 on the external connecting part 142 side is exposed in the width direction of the electrode-attached substrate 24. Also, the cathode 18 is formed to come in contact with the extracting electrode 22. In this case, the cathode 18 may be formed to cover a part of the extracting electrode 22 as shown in FIG. 6.

The cathode 18 is continuously formed over a plurality of regions 26 for forming organic EL elements along the longitudinal direction of the electrode-attached substrate 24. In other words, the cathode 18 formed in the cathode forming-step S12 is a long cathode 18 extending along the conveying direction. Examples of the method for forming the cathode 18 include the coating method which is the same as in forming of the organic EL body 16. The cathode 18, however, may be formed by vacuum deposition, sputtering, or a laminating method for thermally compressing a metal film.

In an embodiment with the cathode 18 having a laminate structure, each of the layers to be the cathode 18 may be sequentially formed from the layer located at the organic EL body 16 side while the electrode-attached substrate 24 is being conveyed in the longitudinal direction.

(Sealing Step)

Figure 7:
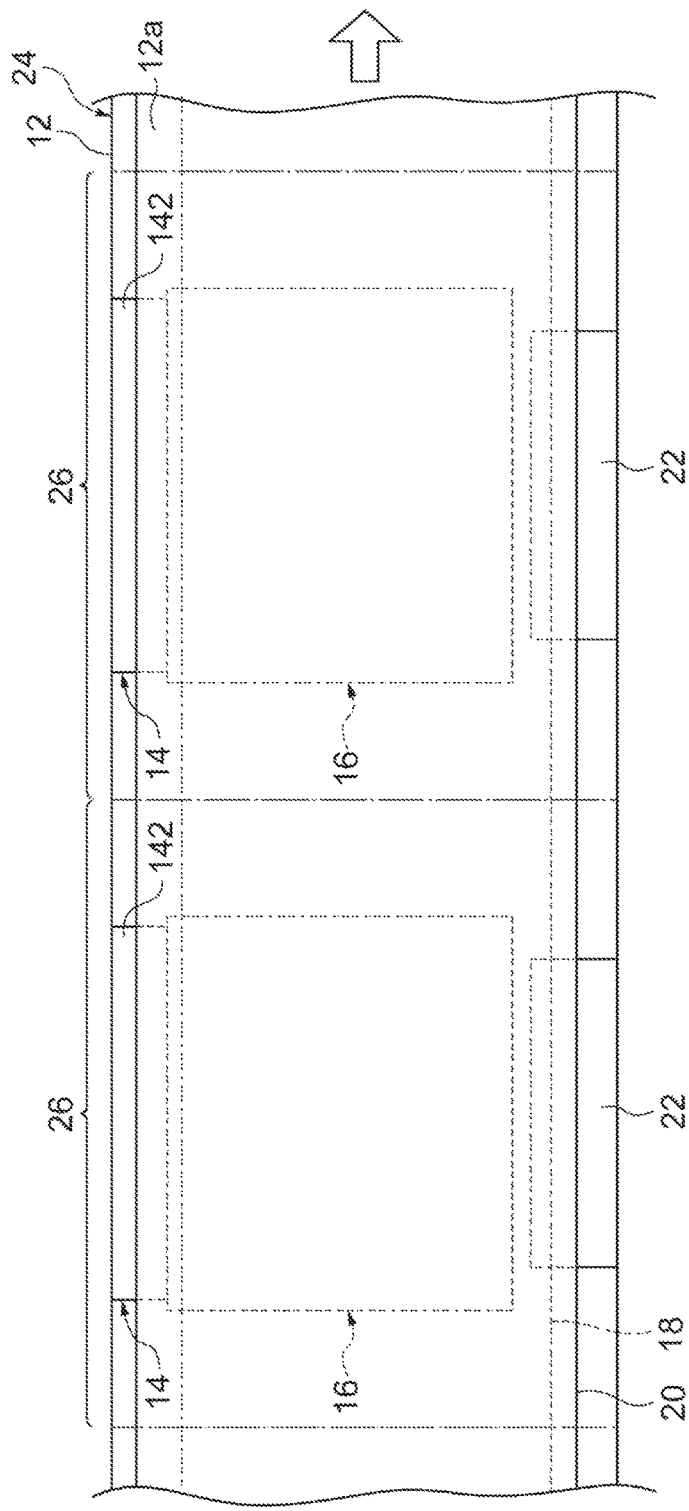
FIG. 7 is a diagram illustrating a step of sealing.

In the sealing step S14, while the electrode-attached substrate 24 having the cathode 18 formed thereon is being conveyed in the longitudinal direction, the sealing member 20 is stuck to the electrode-attached substrate 24 over a plurality of regions 26 for forming organic EL elements from the cathode 18 side, so that the organic EL body 16 is sealed with the sealing member 20. By the sealing step S14, an electrode-attached substrate 24 on which the sealing member 20 extending in the longitudinal direction is stuck to over a plurality of the regions 26 for forming organic EL elements is obtained as shown in FIG. 7.

Figure 8:
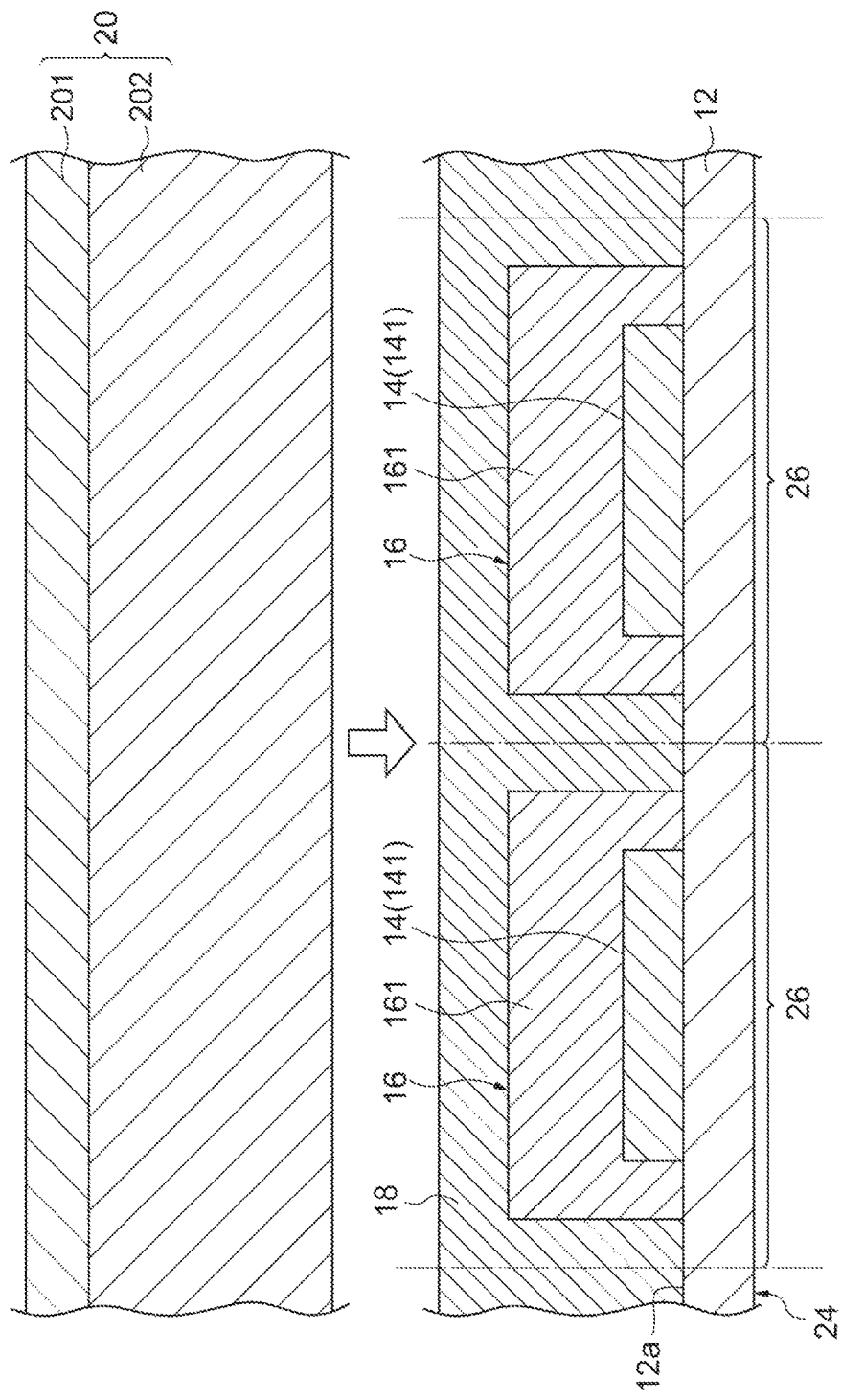
FIG. 8 is a diagram illustrating a step of sealing.

Specifically, in the sealing step S14, the sealing member 20 is stuck to the electrode-attached substrate 24, which has been subjected to the cathode-forming step S12, from the cathode 18 side as shown in FIG. 8. On this occasion, the sealing member 20 is stuck to the electrode-attached substrate 24 such that the adhesive part 202 side of the sealing member 20 is located on the electrode-attached substrate 24. The width of the sealing member 20 is narrower than the width of the electrode-attached substrate 24 as shown in FIG. 7, and the sealing member 20 is stuck to the electrode-attached substrate 24 such that a part of the external connecting part 142 of the anode 14 and a part of the extracting electrode 22 are exposed.

Figure 9:
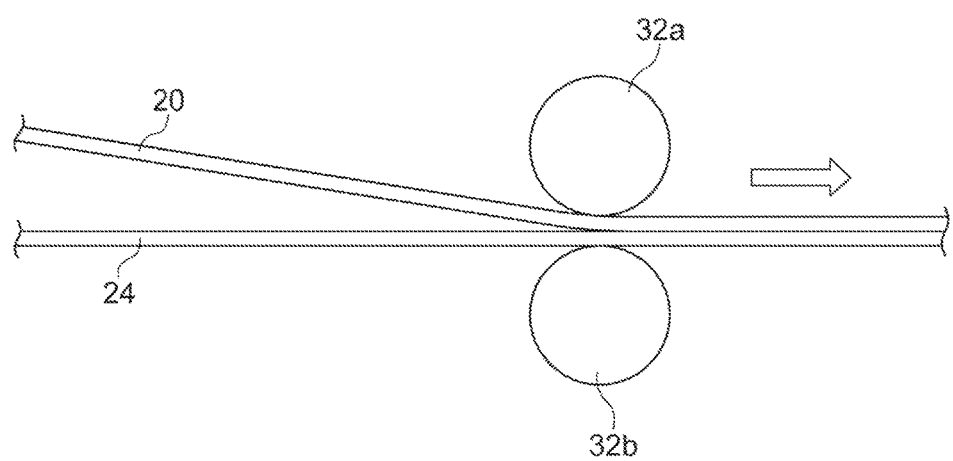
FIG. 9 is a diagram illustrating a step of sealing by a roll-to-roll method.

In the roll-to-roll method, as schematically shown in FIG. 9, while the electrode-attached substrate 24 is being conveyed, the long sealing member 20 is continuously stuck onto the electrode-attached substrate 24 having cathodes 18 formed thereon from the cathode 18 side. The electrode-attached substrate 24 and the sealing member 20 pass between heating rollers 32a and 32b. As a result, the electrode-attached substrate 24 and the sealing member 20 are heated under pressure with the heating rollers 32a and 32b. The adhesive part 202 is thereby softened to make close contact with the components on the electrode-attached substrate 24 that is to be covered with the adhesive part 202. In FIG. 9, the illustration of the configuration on the electrode-attached substrate 24 and the configuration of the sealing member 20 is omitted.

Figure 4:
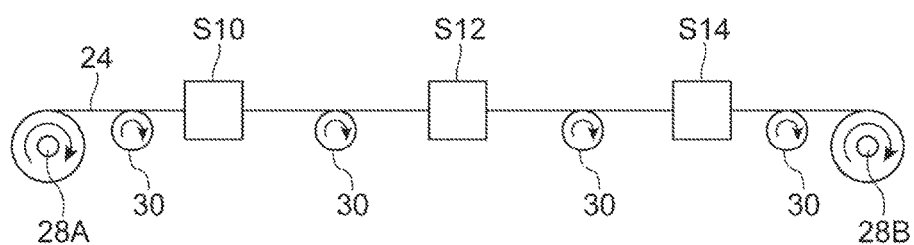
FIG. 4 is a schematic diagram illustrating the method for manufacturing organic EL elements by a roll-to-roll method.

As conceptually shown in FIG. 4, in the first embodiment, the electrode-attached substrate 24 having long cathodes 18 formed thereon is wound around a winding roll 28B after the cathode-forming step S12.

(Cutting Step)

In the cutting step S16, the electrode-attached substrate 24 once wound after the sealing step S14 is further reeled out to be conveyed in the longitudinal direction of the electrode-attached substrate 24 with conveying rollers 30 as shown in FIG. 10(A). While being conveyed in the longitudinal direction, the electrode-attached substrate 24 is cut at between the adjacent regions 26 for forming organic EL elements in the width direction of the electrode-attached substrate 24, so that the organic EL elements 10 are obtained as shown in FIG. 10(B). In FIG. 10(A), a cutting apparatus 34 is schematically shown.

In the method for manufacturing organic EL elements 10 shown above as an example, the steps other than the cutting step S16 are continuously performed by a roll-to-roll method. In the case where spaces are disposed between the edges 24a and 24b of the electrode-attached substrate 24, and the regions 26 for forming organic EL elements, the cutting step S16 may be included in the roll-to-roll method ranging to the sealing step S14, provided that the regions 26 for forming organic El elements are cut out from the electrode-attached substrate 24 in the cutting step S16 and a part of the electrode-attached substrate 24 remains to be conveyed.

On the contrary, the roll-to-roll method may be employed for each of the body-forming step S10, the cathode-forming step S12, and the sealing step S14. In other words, in each of the body-forming step S10, the cathode-forming step S12, and the sealing step S14, the electrode-attached substrate 24 may be wound once, and then a subsequent step may be performed.

Although the electrode-attached substrate 24 is prepared in advance in the manufacturing method described above, for example, a step for forming anodes 14 and extracting electrodes 22 on a long supporting substrate 12 may be further provided.

In the organic EL element 10, the cathode 18 extends in a predetermined direction (the X-axis direction in FIG. 1). In other words, the cathode 18 is disposed extending from the side surface 12b to the side surface 12c of the supporting substrate 12 as shown in FIG. 1 and FIG. 2(A). Consequently, as long as the width in the direction perpendicular to a predetermined direction (the Y-axis direction or the width direction) is controlled in manufacturing the organic EL elements 10, patterning of the cathode 18 in the predetermined direction is not required. The manufacturing of organic EL elements 10 is therefore easy. In particular, when an ink-jet printing method is employed, the width in the direction perpendicular to a predetermined direction of the cathode 18 (the Y-axis direction or the width direction) can be easily controlled, for example, by selecting the nozzle to discharge a coating liquid.

An organic EL element 10 having both side surfaces of a supporting substrate 12, a cathode 18, and a sealing member 20 made evened, respectively, can be suitably manufactured by the method for manufacturing organic EL elements 10. Specifically, as shown as an example, while the electrode-attached substrate 24 is being conveyed in the longitudinal direction thereof, a long cathode 18 is continuously formed in the conveying direction, and an organic EL body 16 is then sealed with a sealing member 20. Subsequently the organic EL body 16 is cut at a predetermined position to obtain organic EL elements 10. As a result, cathode patterning required for an embodiment with a cathode embedded in a sealing member is unnecessary. Accordingly, in the method for manufacturing organic EL elements 10, the productivity of organic EL elements 10 is improved. Further, such a manufacturing method described above is suitable for manufacturing by a roll-to-roll method shown as an example. In the roll-to-roll method, each of the steps in the method for manufacturing organic EL elements 10 can be continuously performed while the long electrode-attached substrate 24 is being conveyed, so that the productivity is further improved.

In the organic EL element 10, although the side surface 18a and the side surface 18b of the cathode 18 are exposed without cover of the sealing member 20, deterioration of the organic EL element 10 can be prevented by using a material not sensitive to moisture as the cathode 18.

Second Embodiment

Figure 11:
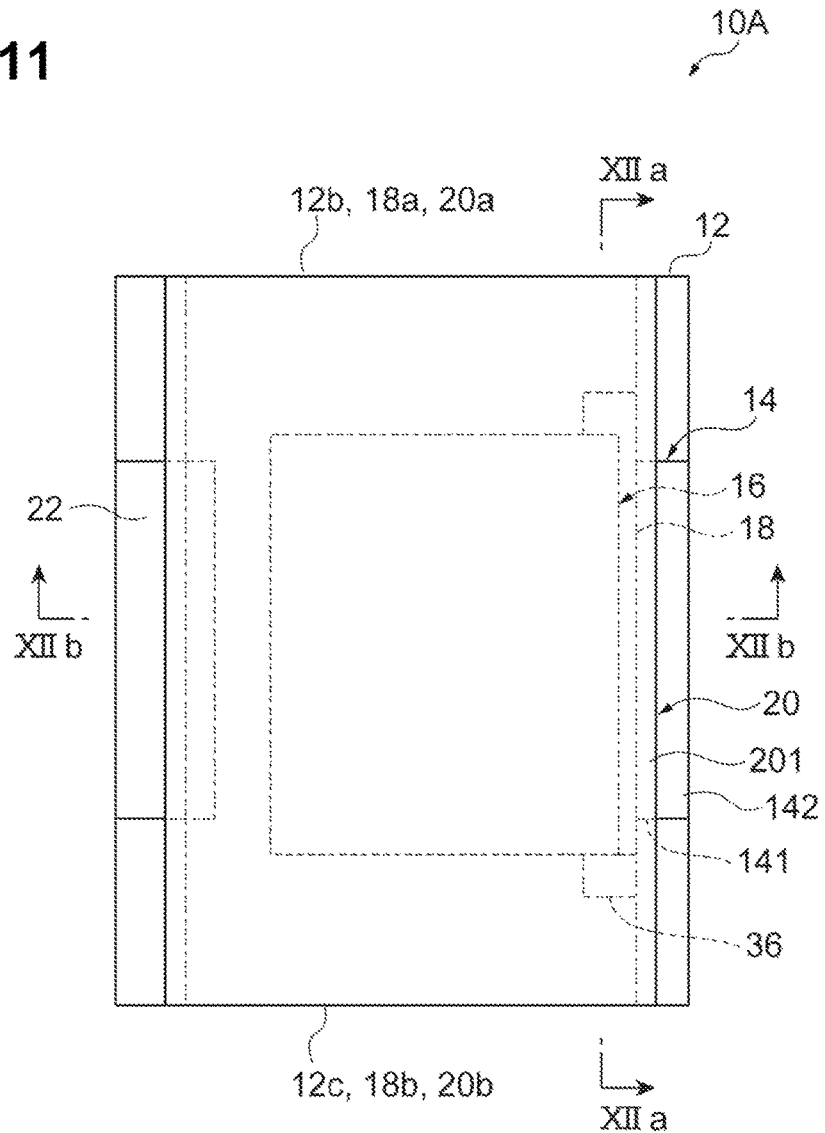
FIG. 11 is a plan view of an organic EL element in other embodiment.
Figure 12A:
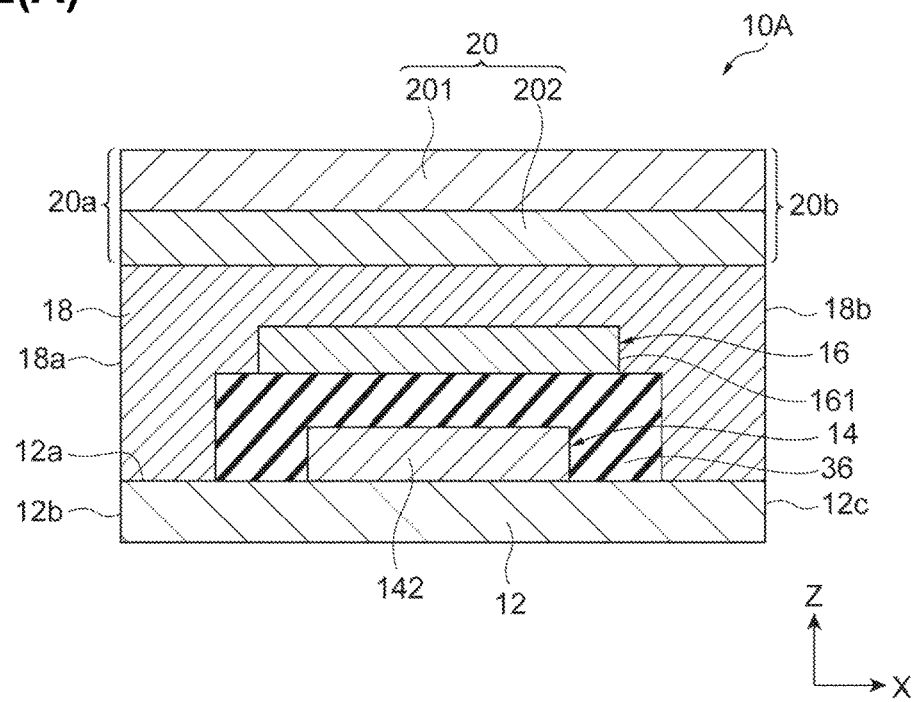
FIG. 12(A) is a cross-sectional view taken from line XIIa-XIIa in FIG. 11.
Figure 12B:
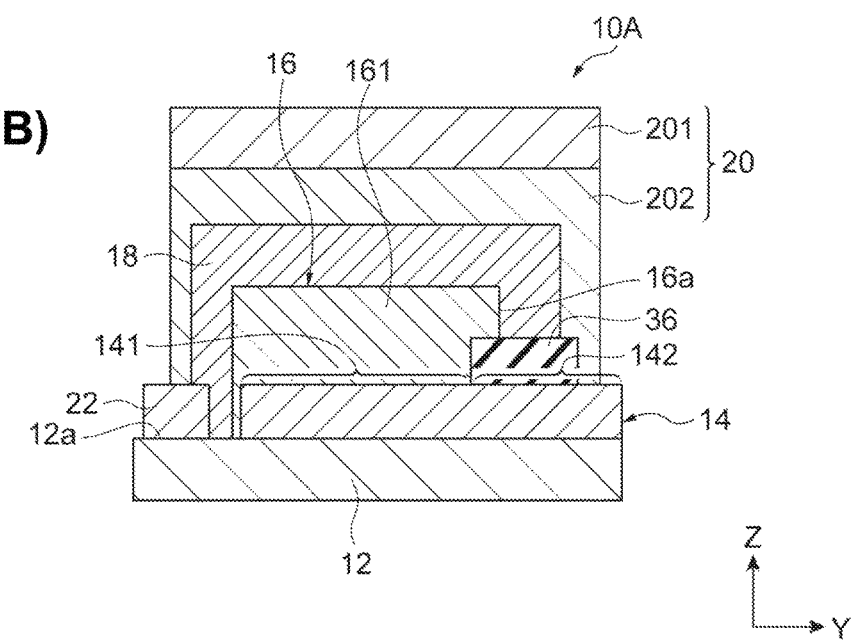
FIG. 12(B) is a cross-sectional view taken from line XIIb-XIIb in FIG. 11.

With reference to FIG. 11, FIG. 12(A) an FIG. 12(B), an organic EL element 10A in a second embodiment is described. The organic EL element 10A includes an insulating layer 36 on the anode 14, which is different mainly from the configuration of the organic EL element 10. Focusing on the difference, the organic EL element 10A is described. Unless otherwise noted, in the second embodiment also, an organic EL body 16 has a single layer structure including a light emitting layer 161.

The insulating layer 36 is disposed adjacent to the organic EL body 16 on an external connecting part 142. A part of the organic EL body 16 may be disposed on the insulating layer 36. Examples of the material for the insulating layer 36 include photosensitive polyimide resins, acrylic resins, epoxy resins, and phenol resins, and specifically including resist materials. The thickness of the insulating layer 36 is, for example, 0.1 µm to 10 µm.

In the organic EL element 10A, a cathode 18 covers an edge 16a of the organic EL body 16 also, and the cathode 18 is formed also on the insulating layer 36 as shown in FIG. 12(A) and FIG. 12(B). In other words, the insulating layer 36 is disposed between the cathode 18 and an external connecting part 142.

The organic EL elements 10A can be manufactured by the same method as for manufacturing the organic EL elements 10, except that an insulating layer-forming step for forming the insulating layer 36 is provided before the cathode-forming step S12 shown in FIG. 4. In the insulating layer-forming step, while the electrode-attached substrate 24 is being conveyed in the longitudinal direction thereof, the insulating layer 36 may be formed, for example, by a coating method. Examples of the coating method include an ink-jet printing method.

The insulating layer-forming step may be appropriately performed before the cathode-forming step S12, corresponding to the configuration of the organic EL body 16 and the arrangement relation of the insulating layer 36 relative to the organic EL body 16.

For example, as shown in FIG. 11, FIG. 12(A) and FIG. 12(B), in the configuration where the organic EL body 16 includes the light emitting layer 161 only and the organic EL body 16 is disposed to cover a part of the insulating layer 36, the insulating layer-forming step is performed before the body-forming step S10.

In the case where the organic EL body 16 has a multi-layer structure including the light emitting layer 161 and in the configuration that the organic EL body 16 is disposed to cover a part of the insulating layer 36, the insulating layer-forming step may be performed, for example, before the-body forming step S10 or in the body-forming step S10.

In the case where the insulating layer-forming step is performed before the body-forming step S10, among a plurality of functional layers to constitute the organic EL body 16, each of the functional layers are formed adjacent to the insulating layer 36 until reaching the same thickness as that of the insulating layer 36, and after exceeding the thickness of the insulating layer 36, the remaining functional layers are fainted to cover a part of the insulating layer 36, in the body-forming step S10.

In the case where the insulating layer-forming step is performed in the body-forming step S10, the insulating layer 36 is formed after formation of a predetermined number of functional layers among a plurality of functional layers to constitute the organic EL body 16, in the body-forming step S10. The remaining functional layers of the organic EL body 16 may be then formed to cover a part of the insulating layer 36. The predetermined number is the number of functional layers that allows the total thickness of the predetermined number of functional layers reaches the substantially same thickness as that of the insulating layer 36 in design.

In the configuration with the organic EL body 16 not covering a part of the insulating layer 36, the insulating layer-forming step may be performed before the organic EL body-forming step S10 or between the body-forming step S10 and the cathode-forming step S12.

The organic EL element 10A has substantially the same configuration as that of the organic EL element 10, except that the organic EL element 10A includes an insulating layer 36 on the anode 14, which is mainly different from the configuration of the organic EL element 10. The organic EL element 10A, therefore, achieves at least the effects similar to those of the organic EL element 10A.

In the organic EL element 10A, the insulating layer 36 is disposed between the anode 14 and the cathode 18, so that the short circuit between the anode 14 and the cathode 18 is more reliably prevented. Since the organic EL body 16 including an edge 16a is covered with the cathode 18, the moisture hardly reaches the organic EL body 16, so that deterioration of the organic EL body caused by the moisture can be further prevented. The life of the organic EL element 10A can be, therefore, prolonged.

Third Embodiment

Figure 13:
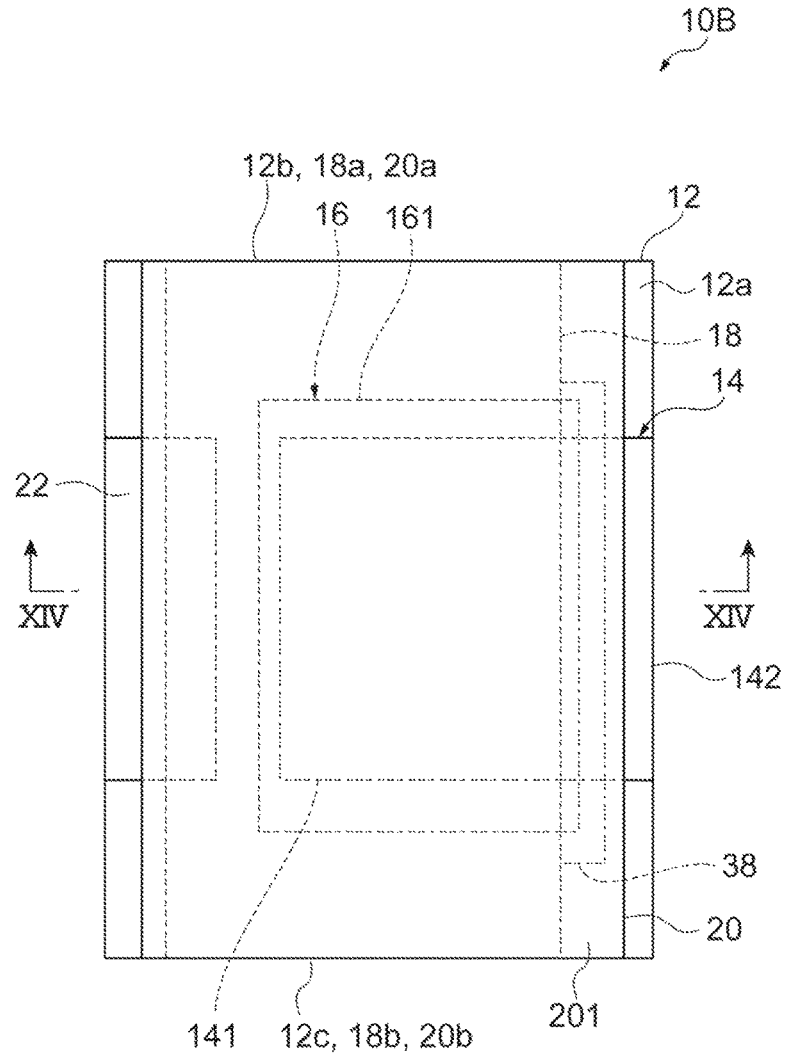
FIG. 13 is a plan view of an organic EL element in a still other embodiment.
Figure 14:
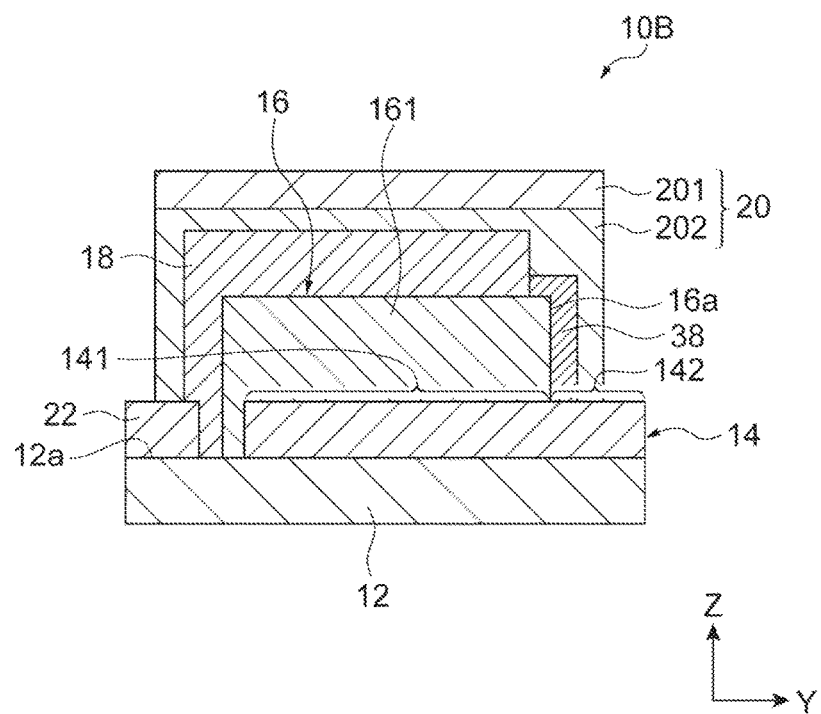
FIG. 14 is a cross-sectional view taken from line XIV-XIV in FIG. 13.

With reference to FIG. 13 and FIG. 14, an organic EL element 10B in a third embodiment is described as follows. The organic EL element 10B includes a hygroscopic part 38, which is mainly different from the configuration of the organic EL element 10. Focusing on the difference, the organic EL element 10B is described as follows.

The hygroscopic part 38 is a desiccant for capturing moisture. The hygroscopic part 38 may capture oxygen or the like other than moisture. The hygroscopic part 38 is disposed to cover an edge 16a of the organic EL body 16 exposing from a cathode 18 on the external connecting part 142 side. The shape of the hygroscopic part 38 is not limited as long as the edge 16a can be covered.

It is preferable that the hygroscopic rate of the hygroscopic part 38 be 1 wt %/h or more under an environment at a temperature of 24° C. and a humidity of 55% RH.

The organic EL elements 10B can be manufactured by the same method as for manufacturing the organic EL elements 10, except that a hygroscopic part-forming step for forming the hygroscopic part 38 is provided between the body-forming step S10 and the cathode-forming step S12 shown in FIG. 4.

In the hygroscopic part-forming step, while the electrode-attached substrate 24 which has been subjected to the body-forming step S10 are being conveyed in the longitudinal direction thereof, the hygroscopic part 38 may be formed, for example, by a coating method. Examples of the coating method include an ink-jet printing method.

Specifically, a coating liquid containing a liquid getter material as precursor of the hygroscopic part 38 is applied to a predetermined position of the organic EL body 16 by a coating method, so as to form the hygroscopic part 38. Specifically, the coating liquid is applied onto the organic EL body 16 and the external connecting part 142 so as to cover the edge 16a of the organic EL body 16. Subsequently, after the coating liquid is dried, the liquid getter material is cured to form into the hygroscopic part 38. The liquid getter material may include a cross-linkable compound having a photoreactive group (curing component). In this case, after the application and shaping of the liquid getter material, the hygroscopic part 38 is formed by performing a UV irradiation treatment to cure the liquid getter material. The liquid getter material may include a cross-linkable compound having a thermally reactive group. In this case, the liquid getter material is cured by a heat treatment.

It is preferable that the hygroscopic part 38 include at least one of organometallic compounds, metal oxides and porous materials such as zeolite, as the liquid getter material. Further, it is preferable that the component metals of the organometallic compounds and the metal oxides include at least one of aluminum, calcium and barium. Organ aluminum compounds, calcium oxide and the like are more preferred, due to having a high refilling rate of water.

The hygroscopic part 38 may include a binder, in particular, such as at least one of an acrylic resin, an epoxy resins, a styrene resin, an olefin resin and an amide resin.

The organic EL element 10B has substantially the same configuration as that of the organic EL element 10, except that the organic EL element 10B includes the hygroscopic part 38, which is mainly different from the configuration of the organic EL element 10. The organic EL element 10B, therefore, achieves at least the effects similar to those of the organic EL element 10.

In the organic EL element 10B, a part of the organic EL body 16 exposed from the cathode 18 is covered with the hygroscopic part 38. Consequently, the part of the organic EL body 16 covered with the cathode 18 allows the cathode 18 to prevent the moisture from reaching the organic EL body 16, and the part of the organic EL body 16 exposed from the cathode 18 allows the hygroscopic part 38 to prevent the moisture from reaching the organic EL body 16. As a result, the moisture hardly reaches the organic EL body 16, so that deterioration of the organic EL element caused by moisture can be further prevented, and the life of the organic EL element 10B can be prolonged.

Various embodiments of the present invention are described above. The present invention, however, is not limited to the various embodiments described above, and various modifications may be made without departing from the scope of the present invention.

Figure 15:
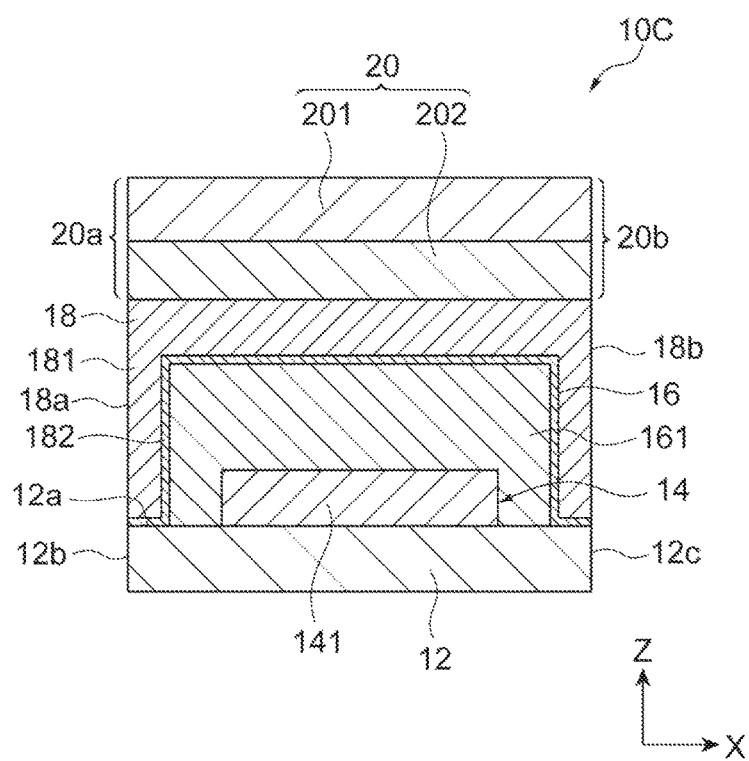
FIG. 15 is a cross-sectional view of an organic EL element in a still other embodiment.

The cathode 18 may have a first cathode layer 181 as the cathode and a second cathode layer 182 functioning as an electron injection layer described in the first to third embodiments, as in an organic EL element 10C schematically shown in FIG. 15. Examples of the material for the second cathode layer 182 include sodium fluoride (NaF). From the viewpoint of reducing the effect of moisture invasion into the organic EL element through the second cathode layer 182, it is preferable that the thickness of the second cathode layer 182 be thin, ranging, for example, from 1 nm to 10 nm.

REFERENCE SIGNS LIST 10, 10A, 10B, and 10C: ORGANIC EL ELEMENT
12: SUPPORTING SUBSTRATE
12b: SIDE SURFACE (FIRST SIDE SURFACE)
12c: SIDE SURFACE (SECOND SIDE SURFACE)
14: ANODE (FIRST ELECTRODE)
16: ORGANIC EL BODY
16a: EDGE
18: CATHODE (SECOND ELECTRODE)
18a: SIDE SURFACE
18b: SIDE SURFACE
20: SEALING MEMBER
20a: SIDE SURFACE
20b: SIDE SURFACE
22: EXTRACTING ELECTRODE
24: ELECTRODE-ATTACHED SUBSTRATE
26: REGION FOR FORMING ORGANIC EL ELEMENT
36: INSULATING LAYER
38: HYGROSCOPIC PART
141: ANODE BODY (FIRST REGION)
142: EXTERNAL CONNECTING PART (SECOND REGION)
161: LIGHT EMITTING LAYER.

The invention claimed is:

1. An organic EL element comprising:
a supporting substrate having a first side surface and a second side surface located opposite to the first side surface in a first direction;
a first electrode disposed on the supporting substrate;
an organic EL body disposed on the first electrode and including a light emitting layer;
a second electrode disposed extending from the first side surface to the second side surface, and covering at least a part of the organic EL body; and
a sealing member disposed on the second electrode, extending from the first side surface to the second side surface, and sealing at least the organic EL body;
each of the side surfaces of the second electrode and the sealing member on the first side surface-side being made evened with the first side surface, and each of the side surfaces of the second electrode and the sealing member on the second side surface-side being made evened with the second side surface, in the first direction, and
wherein the sealing number is a different member from the second electrode, and
wherein side surfaces of the second electrode respectively aligned with the first side surface and the second side surfaces are exposed.

2. The organic EL element according to claim 1, wherein the first electrode has a first region and a second region adjacent to the first region, in a second direction perpendicular to a thickness direction of the supporting substrate and the first direction;
the organic EL body covers the first region; and
an edge of the second region on the opposite side of the first region is exposed from the sealing member in the second direction.

3. The organic EL element according to claim 2, wherein the second electrode covers a part of the organic EL body other than an edge on the second region-side.

4. The organic EL element according to claim 3, wherein the edge of the organic EL body on the second region-side is covered with a hygroscopic part in the second direction.

5. The organic EL element according to claim 2, wherein the second electrode covers the organic EL body; and
an insulating layer is disposed between the second region and the second electrode.

6. The organic EL element according to claim 2, wherein an extracting electrode in electrically contact with the second electrode is further disposed on the supporting substrate;
the extracting electrode is disposed on the opposite side of the second region in the second direction when viewed from the first region; and
a part of the extracting electrode is exposed from the sealing member.

7. The organic EL element according to claim 1, wherein the second electrode comprises transition metal oxides, aluminum or silver.

8. The organic EL element according to claim 1, wherein the sealing member is materially different from the second electrode.

9. The organic EL element according to claim 1, wherein, the sealing member has a sealing substrate and an adhesive part disposed on the sealing substrate.

* * * * *